United States Patent
Park et al.

(10) Patent No.: US 10,910,455 B2
(45) Date of Patent: Feb. 2, 2021

(54) DISPLAY APPARATUS INCLUDING MICROCHIP

(71) Applicant: LG Display Co., Ltd., Seoul (KR)

(72) Inventors: Haejin Park, Osan-si (KR); Kimin Son, Osan-si (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 16/224,666

(22) Filed: Dec. 18, 2018

(65) Prior Publication Data
US 2019/0206974 A1   Jul. 4, 2019

(30) Foreign Application Priority Data

Dec. 29, 2017 (KR) .................. 10-2017-0184655

(51) Int. Cl.
*H01L 27/32* (2006.01)
(52) U.S. Cl.
CPC ...... *H01L 27/3255* (2013.01); *H01L 27/3276* (2013.01); *H01L 27/3248* (2013.01); *H01L 27/3258* (2013.01)
(58) Field of Classification Search
CPC ............. H01L 27/3255; H01L 27/3244; H01L 27/3246; H01L 27/3248; H01L 27/3258; H01L 27/326
See application file for complete search history.

(56) References Cited

U.S. PATENT DOCUMENTS

| 2010/0039357 | A1 | 2/2010 | Cok et al. |
| 2010/0109166 | A1* | 5/2010 | Cok ..................... H01L 27/3255 257/776 |
| 2011/0279014 | A1 | 11/2011 | Winters et al. |
| 2015/0084201 | A1* | 3/2015 | Cok .................. H01L 21/76895 257/773 |
| 2017/0047303 | A1* | 2/2017 | Meitl ...................... H01L 24/81 |

FOREIGN PATENT DOCUMENTS

| KR | 20110044289 A | 4/2011 |
| KR | 20110074844 A | 7/2011 |

* cited by examiner

*Primary Examiner* — Jesse Y Miyoshi
(74) *Attorney, Agent, or Firm* — Polsinelli PC

(57) ABSTRACT

Disclosed is a display apparatus. The display apparatus includes a substrate, a first wiring part on the substrate, a first insulation layer on the first wiring part, a microchip on the first insulation layer, a second wiring part on the microchip, and an organic light emitting device on the second wiring part. The microchip includes a first surface and a second surface opposite to each other, a first pad part on the first surface, and a second pad part on the second surface. The first pad part is connected to the first wiring part, and the second pad part is connected to the second wiring part.

16 Claims, 9 Drawing Sheets

DISPLAY APPARATUS INCLUDING MICROCHIP

CROSS REFERENCE TO RELATED APPLICATION

This application claims the benefit of the Korean Patent Application No. 10-2017-0184655 filed on Dec. 29, 2017, which is hereby incorporated by reference in its entirety as if fully set forth herein.

BACKGROUND

Field of the Disclosure

The present disclosure relates to a display device, and more particularly, to a display apparatus including a microchip. Although the present disclosure is suitable for a wide scope of applications, it is particularly suitable for securing an aperture ratio by integrating a multiple of TFTs into a microchip in the display apparatus.

Description of the Background

In the field of electronic devices, transistors are being widely used as switching elements or driving elements. Particularly, since thin film transistors (TFTs) can be provided on a glass substrate or a plastic substrate, the TFTs are being widely used as switching elements for display apparatuses such as liquid crystal display (LCD) apparatuses and organic light emitting display apparatuses.

Organic light emitting display apparatuses driven by a current include a switching TFT for turning on a pixel and a driving TFT for driving the pixel. Also, in order to enhance display quality, the organic light emitting display apparatuses further include one or more TFTs for compensating for light emission of the pixel. Recently, in the organic light emitting display apparatuses, four or more TFTs are provided in one pixel, and moreover, a maximum of seven TFTs can be provided in one pixel.

In a case where a large number of TFTs are used for driving one pixel, a space is limited, and due to this, it is not easy to place the TFTs. Also, an emission area can be sacrificed for securing an area where the TFTs are placed, causing a reduction in an aperture ratio of an organic light emitting display apparatus.

In order to solve such a problem, research is being recently done for driving an organic light emitting device and controlling light emission of a display apparatus by using a microchip into which one or more TFTs and integrated circuits (ICs) are packaged.

SUMMARY

Accordingly, the present disclosure is directed to providing a display apparatus that substantially obviates one or more problems due to limitations and disadvantages of the prior art.

An aspect of the present disclosure is directed to providing a display apparatus including a microchip.

Another aspect of the present disclosure is directed to providing a display apparatus including a microchip, in which a pad part is provided on each of a first surface and a second surface, and thus, the number of connection pads increases.

Another aspect of the present disclosure is directed to providing a display apparatus in which six or more pixels or twelve or more pixels are driven by one microchip.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a display apparatus including a substrate, a first wiring part on the substrate, a first insulation layer on the first wiring part, a microchip on the first insulation layer, a second wiring part on the microchip, and an organic light emitting device on the second wiring part, wherein the microchip includes a first surface and a second surface opposite to each other, a first pad part on the first surface, and a second pad part on the second surface, and the first pad part is connected to the first wiring part, and the second pad part is connected to the second wiring part.

In another aspect of the present disclosure, there is provided a display apparatus including a substrate, comprises a plurality of scan lines disposed on the substrate; a first insulation layer disposed on the plurality of scan lines; a chip set disposed on the first insulation layer, driving at least six unit pixels of the display apparatus, wherein the chip set has first and second surfaces opposite to each other, a first pad part disposed on the first surface and electrically connected to the plurality of scan lines, and a second pad part disposed on the second surface; a plurality of data lines electrically connected to the second par part, wherein the number of data lines is one more than the number of scan lines; and an organic light emitting device disposed on the plurality of data lines.

The first insulation layer may include an adhesive polymer resin.

One of the first wiring part and the second wiring part may include a scan line, and another wiring part may include a data line.

One of the first pad part and the second pad part of the microchip may be connected to the data line, and the other pad part may be connected to the scan line.

The first wiring part may include two or more scan lines, the second wiring part may include three or more data lines, and the microchip may be connected to the two or more scan lines and the three or more data lines.

The microchip may be connected to six or more different organic light emitting devices.

The first pad part of the microchip may be connected to the three or more data lines.

The first pad part of the microchip may be connected to the two or more scan lines.

The second pad part of the microchip may be connected to the two or more scan lines.

The first wiring part may include six or more data lines, the second wiring part may include two or more scan lines, and the microchip may be connected to the six or more data lines and the two or more scan lines.

The microchip may be connected to twelve or more different organic light emitting devices.

The first pad part of the microchip may be connected to the six or more data lines.

The second pad part of the microchip may be connected to the two or more scan lines.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain the principle of the disclosure.

In the drawings.

DETAILED DESCRIPTION

Figure 1:
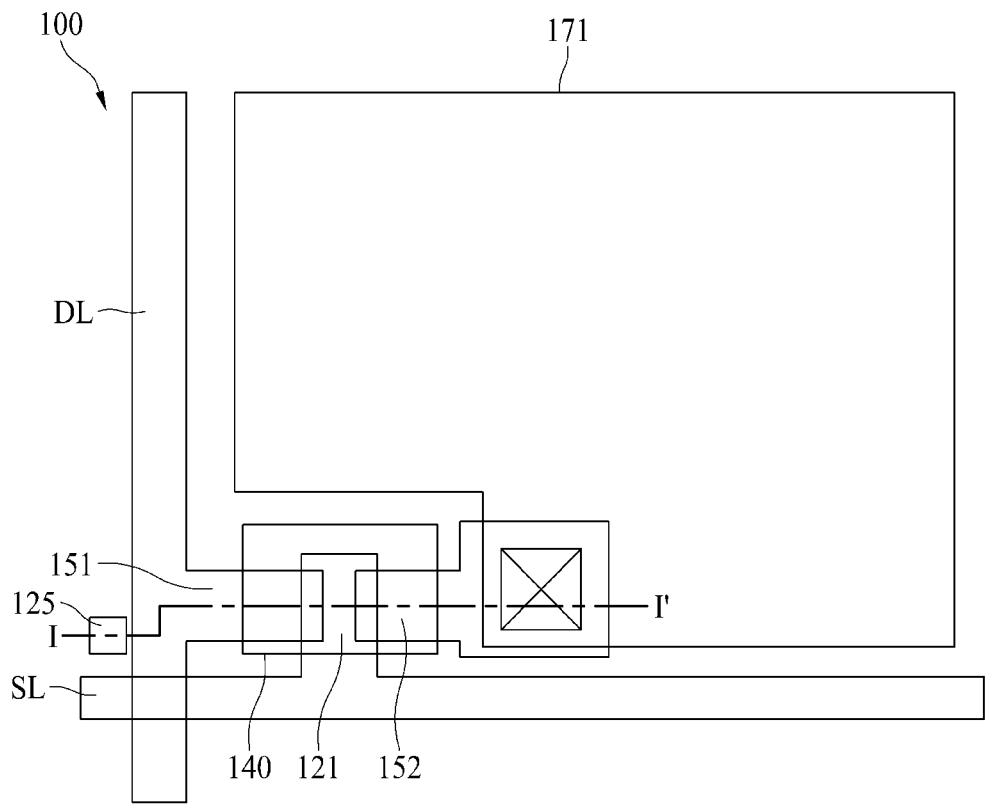
FIG. 1 is a plan view of a display apparatus according to an aspect of the present disclosure.

Reference will now be made in detail to the exemplary aspects of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing aspects of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~' and 'next~', one or more other parts may be disposed between the two parts unless 'just' or 'direct' is used.

Spatially relative terms "below", "beneath", "lower", "above", and "upper" may be used herein for easily describing a relationship between one device or elements and other devices or elements as illustrated in the drawings. It should be understood that spatially relative terms are intended to encompass different orientations of the device in addition to the orientation depicted in the drawings. For example, if a device in the drawings is turned over, elements described as being on the "below" or "beneath" sides of other elements may be placed on "above" sides of the other elements. The exemplary term "lower" may encompass both orientations of "lower" and "upper". Likewise, the exemplary term "above" or "upper" may encompass both orientations of above and below.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

In the specification, in adding reference numerals for elements in each drawing, it should be noted that like reference numerals already used to denote like elements in other drawings are used for elements wherever possible.

Figure 2:
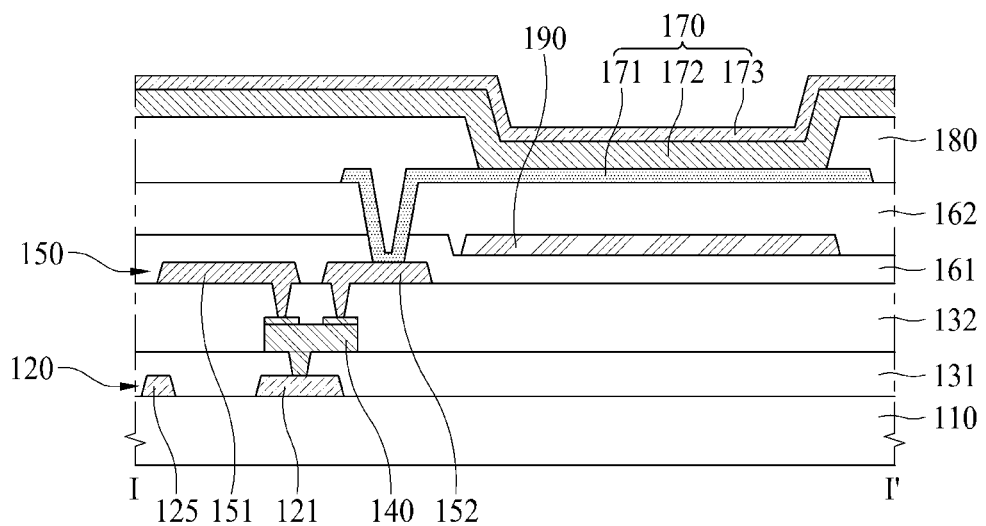
FIG. 2 is a cross-sectional view taken along line I-I' of FIG. 1.

FIG. 1 is a plan view of a display apparatus 100 according to an aspect of the present disclosure, and FIG. 2 is a cross-sectional view taken along line I-I' of FIG. 1.

The display apparatus 100 according to an aspect of the present disclosure may include a substrate 100, a first wiring part 120 on the substrate 100, a first insulation layer 131 on the first wiring part 120, a microchip 140 on the first insulation layer 131, a second wiring part 150 on the microchip 140, and an organic light emitting device 170 on the second wiring part 150. The display apparatus 100 according to an aspect of the present disclosure may be an organic light emitting display apparatus including the organic light emitting device 170.

The substrate 110 may be formed of an insulating material such as glass, quartz, ceramic, and plastic. The substrate 110 including plastic may use, for example, polyimide. When polyimide is used as the substrate 110, heat-resistant polyimide capable of enduring a high temperature may be used in consideration of a high temperature deposition process performed on the substrate 110.

Although not shown, a buffer layer may be disposed on the substrate 110. The buffer layer may include one or more layers selected from among various inorganic layers and organic layers.

The first wiring part 120 may be disposed on the substrate 110. The first wiring part 120 may include a first signal line. The first wiring part 120 may include a scan line SL as the first signal line. However, an aspect of the present disclosure is not limited thereto, and the first wiring part 120 may include a data line DL as the first signal line.

For example, the first wiring part 120 may include the scan line SL and a scan pad 121 extending from the scan line SL. The scan line SL may transfer a scan signal to the microchip 140. The scan pad 121 may act as a connection pad which connects the scan line SL to the microchip 140.

The first wiring part 120 may include an align mark 125. The align mark 125 may be a criterion for aligning the microchip 140 in a process of mounting the microchip 140. The align mark 125 may be formed through the same process as the scan line SL and the scan pad 121. Therefore, according to an aspect of the present disclosure, a separate additional process for forming the align mark 125 is not needed. Accordingly, the cost and time for a process (for example, a mask process) of forming the align mark 125 are reduced.

Each of the scan line SL and the scan pad 21 may be used as a mark for mounting the microchip 140. In this case, the align mark 125 may be omitted.

The first insulation layer 131 may be disposed on the first wiring part 120. The first insulation layer 131 can protect the first wiring part 120 and can secure the microchip 140.

The first insulation layer 131 may be formed of polymer resin having adhesion and insulating properties. In detail, the first insulation layer 131 may include adhesive polymer resin. The first insulation layer 131 may include, for example, at least one of polyacryl, polyurethane, polycarbonate, polyimide, polyamide, and polystyrene. However, a material of the first insulation layer 131 is not limited thereto, and the first insulation layer 131 may be formed of another polymer resin having adhesion and insulating properties.

The microchip 140 may be disposed on the first insulation layer 131. The microchip 140 may be a package device including at least one thin film transistor (TFT) and integrated circuit (IC). The microchip 140 may include one chip set unit.

Figure 3:
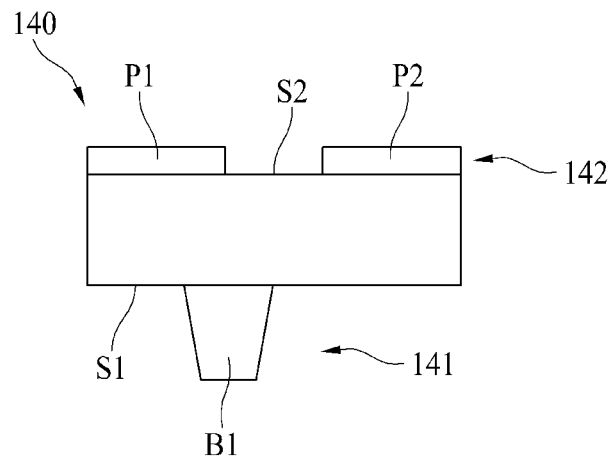
FIG. 3 is a cross-sectional view of a microchip illustrated in FIG. 1.

FIG. 3 is a cross-sectional view of the microchip 140 illustrated in FIG. 1. Referring to FIG. 3, the microchip 140 may include a first surface S1 and a second surface S2 which are opposite to each other. In FIGS. 2 and 3, the first surface S1 of the microchip 140 may be a surface facing the first wiring part 120, and the second surface S2 may be a surface facing the second wiring part 150.

The microchip 140 may include a first pad part 141 on the first surface S1 and a second pad part 142 on the second surface S2. Referring to FIG. 3, the first pad part 141 may include one pad (or a first pad) B1, and the second pad part 142 may include two pads (or first and second pads) P1 and P2. However, an aspect of the present disclosure is not limited thereto. In other aspects, the first pad part 141 may include two or more pads, and the second pad part 142 may include three or more pads.

Referring to FIG. 3, the first pad part 141 on the first surface S1 may include the first pad B1 having a protrusion form. Therefore, the microchip 140 may be aligned on the first insulation layer 131, and then, by applying pressure to the microchip 140, the first pad part 141 of the microchip 140 may pass through the first insulation layer 131 and may be connected to the first wiring part 120. For example, the first pad B1 of the first pad part 141 may contact the scan pad 121.

Since the first insulation layer 131 has an adhesion property, the microchip 140 may be fixed without moving in a process of applying the pressure to the microchip 140. The first pad B1 of the microchip 140 may pass through the first insulation layer 131 and may contact the scan pad 121 of the first wiring part 120, and then, the first insulation layer 131 may be cured by applying heat, light (for example, ultraviolet (UV)), or laser thereto, whereby the microchip 140 can be stably mounted on the first insulation layer 131.

Since the microchip 140 is mounted, the first pad part 141 of the microchip 140 may be connected to the first wiring part 120. In detail, the first pad part 141 of the microchip 140 may be connected to the scan line SL through the scan pad 121. Here, a connection between the first pad part 141 and the first wiring part 120 may denote that the first pad part 141 is connected to signal lines or pads disposed in the first wiring part 120. The following is the same as above.

A second insulation layer 132 may be disposed on the microchip 140. The second insulation layer 132 may be formed of an organic material or an inorganic material. The second insulation layer 132 may be formed of a single layer, or may have a structure where a plurality of layers is stacked. The second insulation layer 132 may have insulating properties and may be referred to as an interlayer insulation layer.

The second wiring part 150 may be disposed on the microchip 140. Referring back to FIG. 2, the second wiring part 150 may be disposed on the second insulation layer 132.

The second wiring part 150 may include a second signal line. The second wiring part 150 may include the data line DL as the second signal line. However, an aspect of the present disclosure is not limited thereto, and the second wiring part 150 may include the data line SL as the second signal line.

Referring back to FIGS. 1 and 2, the second wiring part 150 may include the data line DL, a data pad 151 extending from the data line DL, and a first electrode connection pad 152. The first electrode connection pad 152 may be referred to as a light emitting device bridge.

The data line DL may transfer a data signal to the microchip 140. The data pad 151 may act as a connection pad which connects the data line DL to the microchip 140.

Referring to FIG. 2, the data pad 151 may be connected to the microchip 140 through a contact hole which is provided in the second insulation layer 132. Also, the first electrode connection pad 152 may be connected to the microchip 140 through a contact hole which is provided in the second insulation layer 132.

In more detail, the data pad 151 and the first electrode connection pad 152 may be connected to the second pad part 142 of the microchip 140. Therefore, the second pad part 142 may be connected to the second wiring part 150. Here, a connection between the second pad part 142 and the second wiring part 150 may denote that the second pad part 142 is connected to signal lines or pads disposed in the second wiring part 150. The following is the same as above.

Referring to FIG. 3, the second pad part 142 of the microchip 140 may include the two pads P1 and P2, and one of the two pads P1 and P2 may be connected to the data pad 151 and may be connected to the data line DL, and the other pad may be connected to the first electrode connection pad 152 and may be connected to the first electrode 171.

According to an aspect of the present disclosure, the first wiring part 120 may include the scan line SL, the second wiring part 150 may include the data line DL, the first pad part 141 of the microchip 140 may be connected to the scan line SL, and the second pad part 142 of the microchip 140 may be connected to the data line DL. However, an aspect of the present disclosure is not limited thereto, and the first wiring part 120 and the second wiring part 150 may switch therebetween.

For example, the first wiring part 120 may include the data line DL, the second wiring part 150 may include the scan line SL, the first pad part 141 of the microchip 140 may be connected to the data line DL, and the second pad part 142 of the microchip 140 may be connected to the scan line SL.

In more detail, one of the first wiring part 120 and the second wiring part 150 may include the scan line SL, and the other wiring part may include the data line DL. Also, one of the first pad part 141 and the second pad part 142 of the microchip 140 may be connected to the data line DL, and the other pad part may be connected to the scan line SL.

A passivation layer 161 may be disposed on the second wiring part 150. The passivation layer 161 may be formed of an organic material or an inorganic material. The passivation layer 161 may be formed of a single layer, or may have a structure where a plurality of layers is stacked. The passivation layer 161 may have insulating properties and may protect the second wiring part 150. The passivation layer 161 may be referred to as a third insulation layer.

A color filter 190 may be disposed on the passivation layer 161. The color filter 190 may overlap a first electrode 171. The color filter 190 may be omitted.

A planarization layer 162 may be disposed on the passivation layer 161 and may planarize an upper end of the substrate 110. The planarization layer 162 may be formed of an organic insulating material such as acryl resin having photosensitivity, but is not limited thereto.

The organic light emitting device 170 may be disposed on the planarization layer 162.

The organic light emitting device 170 may include the first electrode 171 on the second wiring part 150, an organic layer 172 on the first electrode 171, and a second electrode 173 on the organic layer 172. The organic layer 172 may include a low-molecular weight organic material or a polymer organic material. A hole from the first electrode 171 and an electron from the second electrode 173 may be injected into the organic layer 172 and may be combined to generate an exciton, and when the exciton is shifted from an excited state to a ground state, light may be emitted.

Referring to FIG. 2, the first electrode 171 may be disposed on the planarization layer 162. The first electrode 171 may be connected to the first electrode connection pad 152 through a contact hole which is provided in the planarization layer 162 and the passivation layer 161. Therefore, the first electrode 171 may be connected to the microchip 140. Referring to FIG. 2, the first electrode 171 may be connected to the second pad part 142 of the microchip 140 through the first electrode connection pad 152.

The first electrode 171 may be a light-transmitting electrode having light-transmitting properties, or may be a reflective electrode having light-reflecting properties.

A bank layer 180 may be disposed on the first electrode 171 and the planarization layer 162 and may define a pixel area or an emission area. For example, the bank layer 180 may be disposed in a matrix structure in a boundary area between adjacent pixels of a plurality of pixels, and thus, the pixel area may be defined.

The organic layer 172 may be disposed on the first electrode 171. The organic layer 172 may also be disposed on the bank layer 180. For example, the organic layer 172 may not be disconnected in a boundary between adjacent pixels and may be connected between adjacent pixels.

The organic layer 172 may include an organic light emitting layer. The organic layer 172 may include one organic light emitting layer, or may include two or more organic light emitting layers which are vertically stacked. The organic layer 172 may emit light having one of red, green, and blue, or may emit white light.

Light emitted from the organic layer 172 may be irradiated via the first electrode 171, or may be irradiated via the second electrode 173.

The second electrode 173 may be disposed on the organic layer 172. The second electrode 173 may be formed of a transmissive layer, a semi-transmissive layer, or a reflective layer.

The organic light emitting device 170 may be formed by stacking the first electrode 171, the organic layer 172, and the second electrode 173. The organic light emitting device 172 may control the amount of light in the display apparatus 100.

In a case where the organic layer 172 emits white light, each of the plurality of pixels may include the color filter 190 for filtering, by wavelengths, the white light emitted from the organic layer 172. The color filter 190 may be disposed on a light movement path. In a bottom emission type where the light emitted from the organic layer 172 travels in a direction toward the substrate 110 disposed in a lower portion, the color filter 190 may be disposed under the organic layer 172. In a top emission type where the light emitted from the organic layer 172 travels in a direction toward the second electrode 173 disposed in an upper portion, the color filter 190 may be disposed on the organic layer 172.

A capping layer (not shown) may be disposed on the second electrode 173, for protecting the organic light emitting device 170 from an external environment.

Hereinafter, a display apparatus 200 according to another aspect of the present disclosure will be described with reference to FIGS. 4 to 10.

Figure 4:
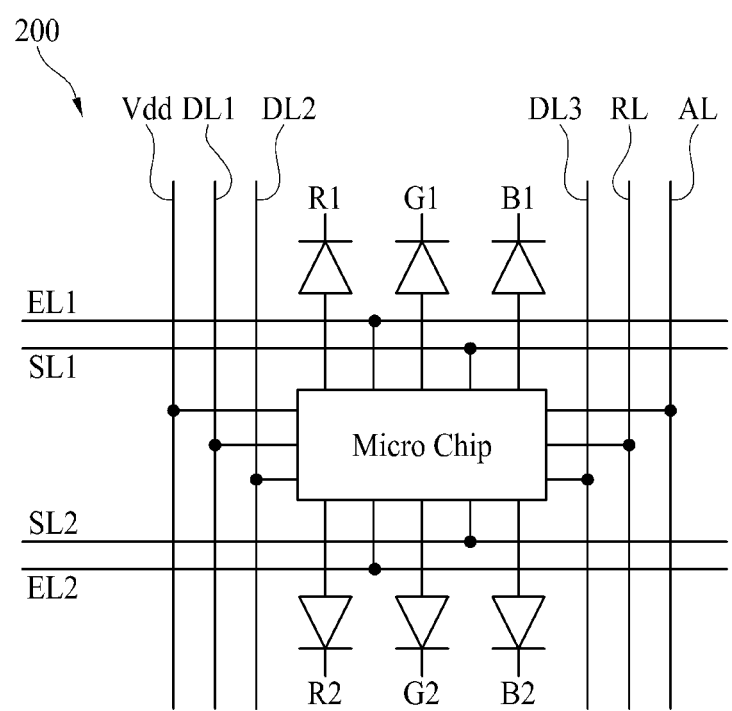
FIG. 4 is a conceptual view of a display apparatus according to another aspect of the present disclosure.
Figure 5:
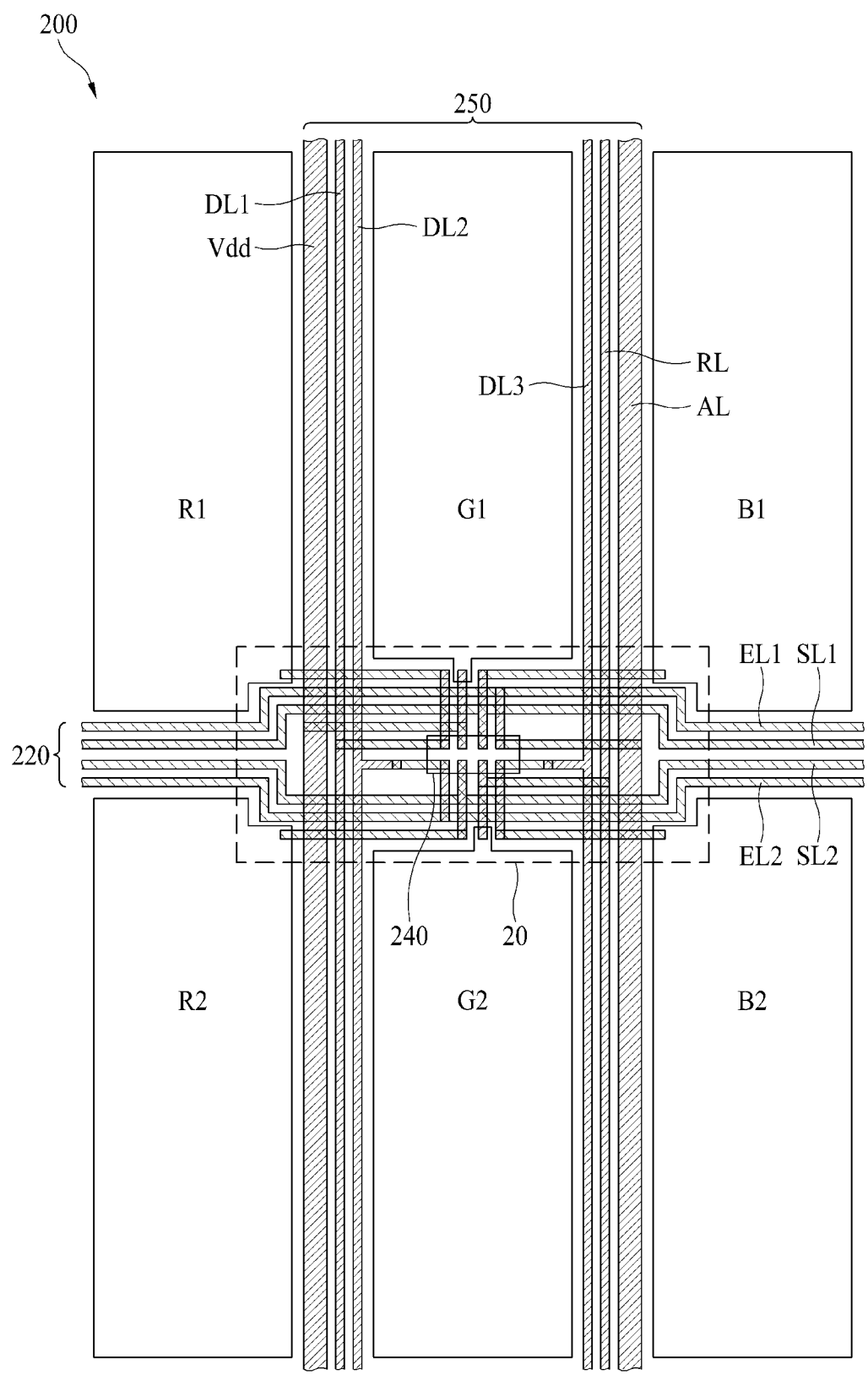
FIG. 5 is a plan view of a display apparatus according to another aspect of the present disclosure.

FIG. 4 is a conceptual view of the display apparatus 200 according to another aspect of the present disclosure, and FIG. 5 is a plan view of the display apparatus 200 according to another aspect of the present disclosure.

Referring to FIGS. 4 to 10, the display apparatus 200 according to another aspect of the present disclosure may include a first wiring part 220 and a second wiring part 250.

The first wiring part 220 may include a plurality of first signal lines. The first wiring part 220 may include a plurality of scan lines (for example, first and second scan lines) SL1 and SL2 as the first signal lines. Also, the first wiring part 220 may include various bridges DL1_br, DL2_br, DL3_br, Vdd_br, RL_br, AL_br, R1_br1, R2_br1, B1_br1, and B2_br1. However, the present aspect is not limited thereto.

In other aspects, the first wiring part 220 may include a plurality of data lines (for example, first to third data lines) DL1 to DL3 as the first signal lines.

The second wiring part 250 may include a plurality of second signal lines. The second wiring part 250 may include the plurality of data lines DL1 to DL3 as the second signal lines. Also, the second wiring part 250 may include various bridges R1_br2, G1_br, B1_br2, R2_br2, G2_br, B2_br2, EL1_br, and EL2_br. However, the present aspect is not limited thereto. In other aspects, the second wiring part 250 may include the plurality of scan lines SL1 and SL2 as the second signal lines.

Referring to FIGS. 4 and 5, the first wiring part 220 may include two or more scan lines SL1 and SL2, and the second wiring part 250 may include three or more data lines DL1 to DL3. The microchip 240 may be connected to the two or more scan lines SL1 and SL2 and the three or more data lines DL1 to DL3.

Moreover, the first wiring part 220 may further include two or more sensing lines (for example, first and second sensing lines) EL1 and EL2, and the second wiring part 250 may further include a common power line Vdd, an initialization line RL, and an auxiliary line AL. A voltage Vss which is lower than a voltage supplied through the common power line Vdd may be applied to the auxiliary line AL.

Referring to FIGS. 4 and 5, one microchip 240 may drive six organic light emitting devices R1, G1, B1, R2, G2, and B2. In detail, the one microchip 240 may drive a first red organic light emitting device R1, a first green organic light emitting device G1, a first blue organic light emitting device B1, a second red organic light emitting device R2, a second green organic light emitting device G2, and a second blue organic light emitting device B2.

Here, the first and second red organic light emitting devices R1 and R2 may include an organic light emitting device 170 including an organic layer 172 emitting red light, or may include an organic light emitting device 170 which includes an organic layer 172 emitting white light and a red color filter. The first and second green organic light emitting devices G1 and G2 may include an organic light emitting device 170 including an organic layer 172 emitting green light, or may include an organic light emitting device 170 which includes an organic layer 172 emitting white light and a green color filter. The first and second blue organic light emitting devices B1 and B2 may include an organic light emitting device 170 including an organic layer 172 emitting blue light, or may include an organic light emitting device 170 which includes an organic layer 172 emitting white light and a blue color filter. The following is the same as above.

Therefore, according to another aspect of the present disclosure, the microchip 240 may be connected to six or more different first electrodes 171.

In a related art organic light emitting display apparatus, two to seven TFTs are used for driving one organic light emitting device 170. For this reason, in the related art organic light emitting display apparatus, an area occupied by the TFTs increases, and due to this, an aperture ratio is reduced. However, according to another aspect of the present disclosure, since the one microchip 240 drives the six organic light emitting devices R1, G1, B1, R2, G2, and B2, an area occupied by a device for driving the organic light emitting devices is relatively small. Accordingly, according to another aspect of the present disclosure, an aperture ratio of the display apparatus 200 is enhanced.

Hereinafter, a connection relationship between the first and second wiring parts 220 and 250 and the microchip 240 will be described in more detail with reference to FIGS. 6 to 10. Referring to FIGS. 6 to 10, a first pad part 241 of the microchip 240 may be connected to the first wiring part 220, and a second pad part 242 may be connected to the second wiring part 250. Here, a connection between the first pad part 241 and the first wiring part 220 may denote that the first pad part 241 is connected to signal lines or bridges disposed in the first wiring part 220. Also, a connection between the second pad part 242 and the second wiring part 250 may denote that the second pad part 242 is connected to signal lines or bridges disposed in the second wiring part 250. The following is the same as above.

Figure 6:
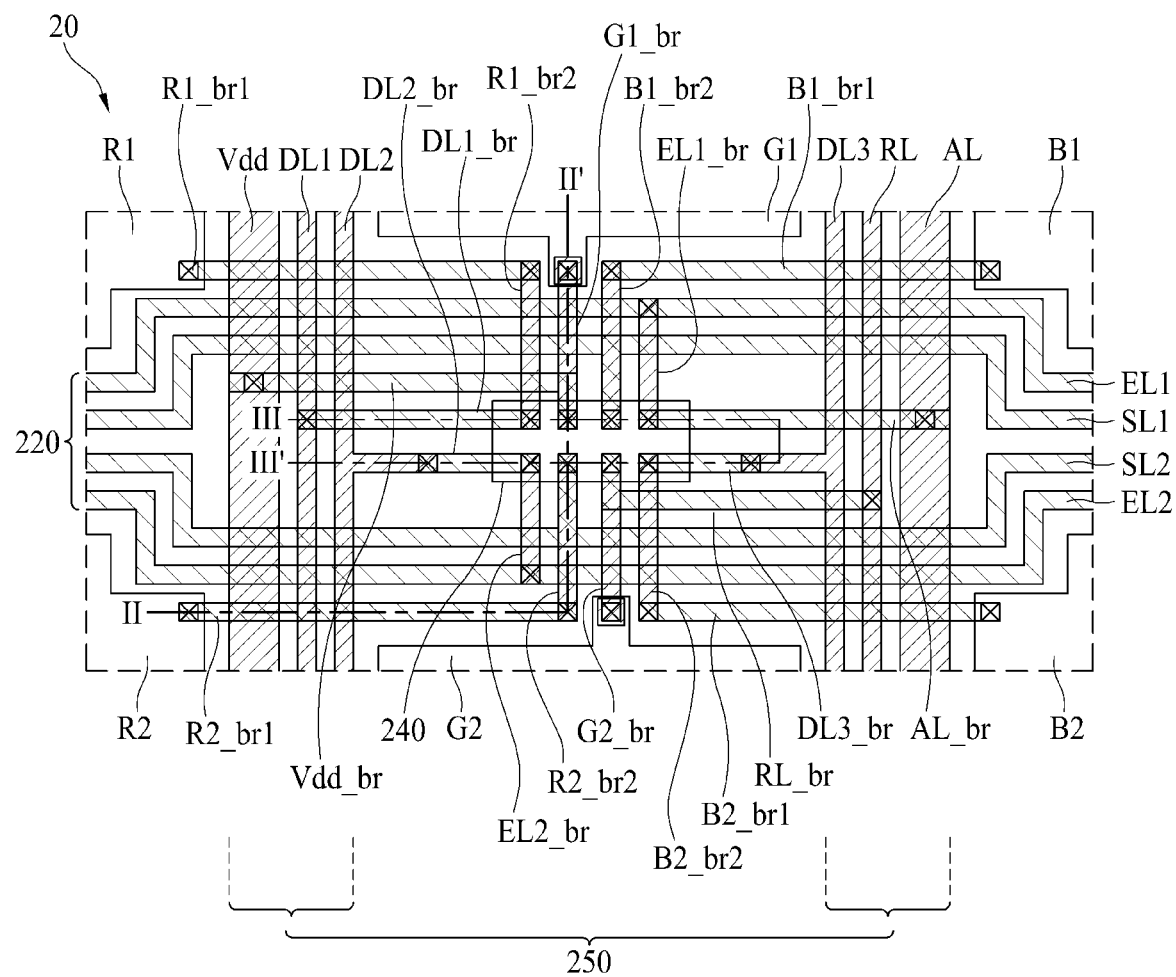
FIG. 6 is an enlarged view of a portion 20 of FIG. 5.
Figure 7:
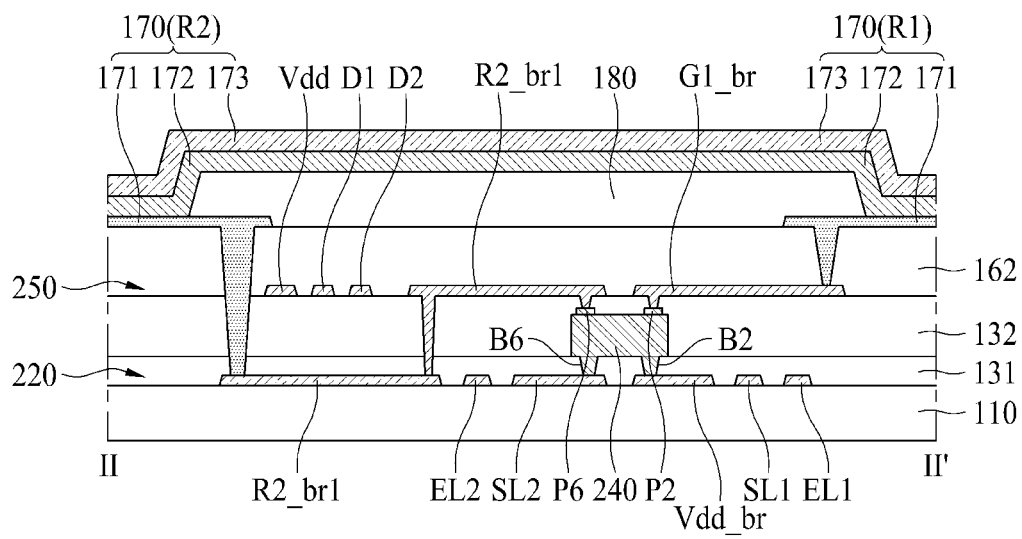
FIG. 7 is a cross-sectional view taken along line II-II' of FIG. 6.
Figure 8:
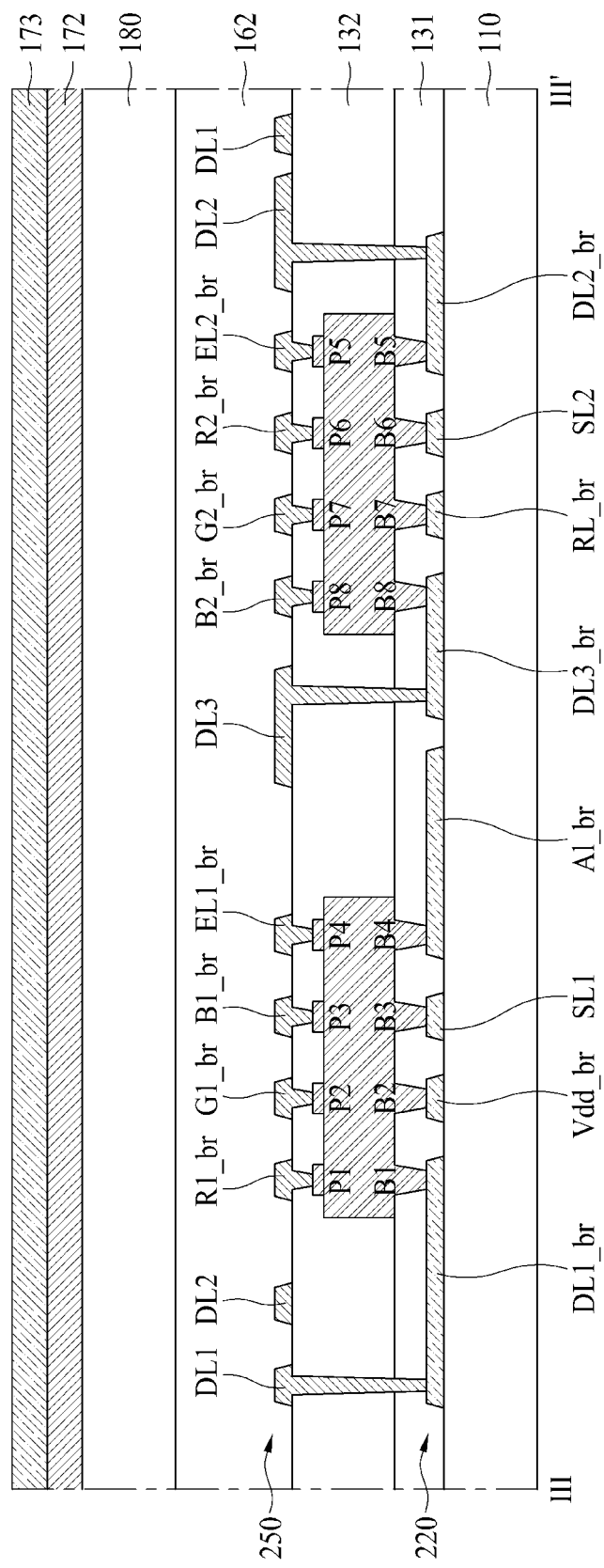
FIG. 8 is a cross-sectional view taken along line III-III' of FIG. 6.
Figure 9:
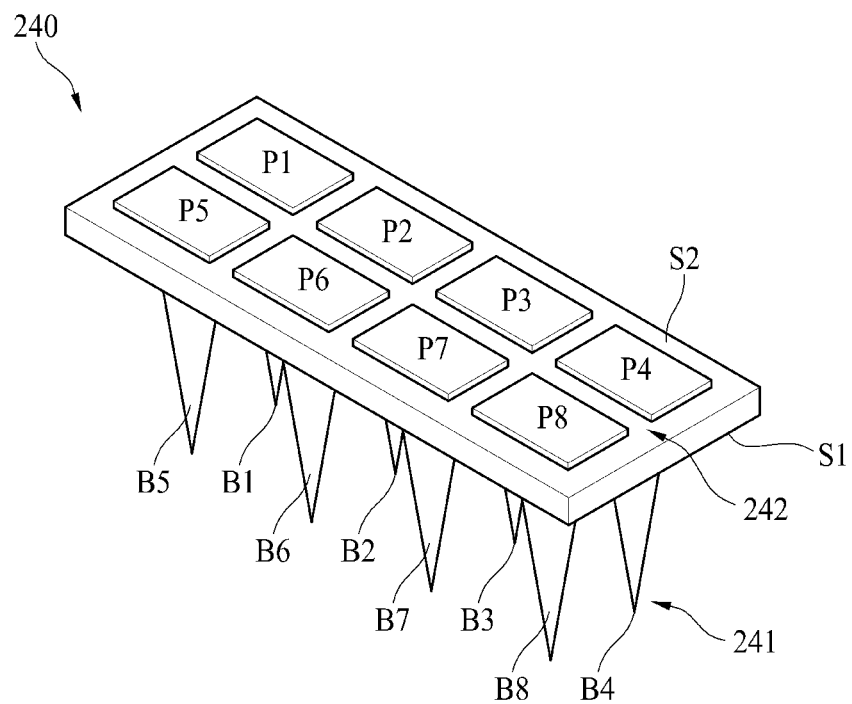
FIG. 9 is a perspective view of a microchip illustrated in FIG. 5.
Figure 10:
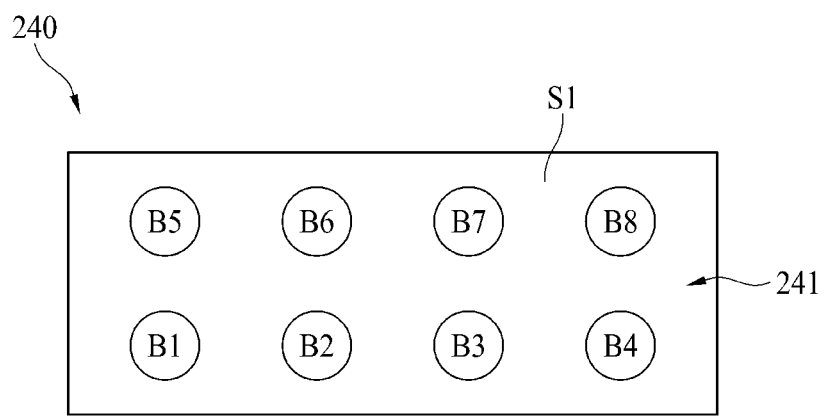
FIG. 10 is a plan view of a first surface of the microchip illustrated in FIG. 9.

FIG. 6 is an enlarged view of a portion 20 of FIG. 5. FIG. 7 is a cross-sectional view taken along line II-II' of FIG. 6. FIG. 8 is a cross-sectional view taken along line III-III' of FIG. 6. FIG. 9 is a perspective view of the microchip 240 illustrated in FIG. 5. FIG. 10 is a plan view of a first surface S1 of the microchip 240 illustrated in FIG. 9.

The first scan line SL1 disposed in the first wiring part 220 may be connected to a third pad B3 of the first pad part 241 of the microchip 240.

The second scan line SL2 may be connected to a sixth pad B6 of the first pad part 241 of the microchip 240.

The first sensing line EL1 disposed in the first wiring part 220 may be connected to a fourth pad P4 of the second pad part 242 of the microchip 240 through a first sensing bridge EL1_br disposed in the second wiring part 250.

The second sensing line EL2 disposed in the second wiring part 250 may be connected to a fifth pad P5 of the second pad part 242 of the microchip 240 through a second sensing bridge EL2_br disposed in the second wiring part 250.

The common power line Vdd disposed in the second wiring part 250 may be connected to a second pad B2 of the first pad part 241 of the microchip 240 through a power bridge Vdd_br disposed in the first wiring part 220.

The first data line DL1 may be connected to a first pad B1 of the first pad part 241 of the microchip 240 through a first data bridge DL1_br disposed in the first wiring part 220.

The second data line DL2 may be connected to a fifth pad B5 of the first pad part 241 of the microchip 240 through a second data bridge DL2_br disposed in the first wiring part 220.

The third data line DL3 may be connected to an eighth pad B8 of the first pad part 241 of the microchip 240 through a third data bridge DL3_br disposed in the first wiring part 220.

The initialization line RL may be connected to a seventh pad B7 of the first pad part 241 of the microchip 240 through an initialization bridge RL_br disposed in the first wiring part 220.

The auxiliary line AL may be connected to a fourth pad B4 of the first pad part 241 of the microchip 240 through an auxiliary bridge AL_br disposed in the first wiring part 220.

The first red organic light emitting device R1 may be connected to a first pad P1 of the second pad part 242 of the microchip 240 through a first bridge R1_br1 disposed in the first wiring part 220 and a second bridge R1_br2 disposed in the second wiring part 250.

The first green organic light emitting device G1 may be connected to a second pad P2 of the second pad part 242 of the microchip 240 through a first green bridge G1_br disposed in the second wiring part 250.

The first blue organic light emitting device B1 may be connected to a third pad P3 of the second pad part 242 of the microchip 240 through a first bridge B1_br1 disposed in the first wiring part 220 and a second bridge B1_br2 disposed in the second wiring part 250.

The second red organic light emitting device R2 may be connected to a sixth pad P6 of the second pad part 242 of the microchip 240 through a first bridge R2_br1 disposed in the first wiring part 220 and a second bridge R2_br2 disposed in the second wiring part 250.

The second green organic light emitting device G2 may be connected to a seventh pad P7 of the second pad part 242 of the microchip 240 through a second green bridge G2_br disposed in the second wiring part 250.

The second blue organic light emitting device B2 may be connected to an eighth pad P8 of the second pad part 242 of the microchip 240 through a first bridge B2_br1 disposed in the first wiring part 220 and a second bridge B2_br2 disposed in the second wiring part 250.

Hereinabove, the first pad B1, the fifth pad B5, and the eighth pad B8 of the first pad part 241 of the microchip 240 may be connected to the data lines DL1 to DL3. In this manner, the first pad part 241 of the microchip 240 may be connected to three or more data lines DL1 to DL3.

The third pad B3 and the sixth pad B6 of the first pad part 241 of the microchip 240 may be connected to the scan lines SL1 and SL2. In this manner, the first pad part 241 of the microchip 240 may be connected to two or more scan lines SL1 and SL2.

The fourth pad P4 and the fifth pad P5 of the second pad part 242 of the microchip 240 may be respectively connected to the first sensing line EL1 and the second sensing line EL2.

The first sensing line EL1 and the first scan line SL1 may switch therebetween, and the second sensing line EL2 and the second scan line SL2 may switch therebetween.

For example, the first sensing line EL1 of FIGS. 5 and 6 may be used as the first scan line SL1, and the second sensing line EL2 may be used as the second scan line SL2. In this case, the third pad B3 and the sixth pad B6 of the first pad part 241 of the microchip 240 may be connected to the sensing lines EL1 and EL2, and the fourth pad P4 and the fifth pad P5 of the second pad part 242 may be connected to the scan lines SL1 and SL2. In this case, the second pad part 242 of the microchip 240 may be connected to the two or more scan lines SL1 and SL2.

Figure 11:
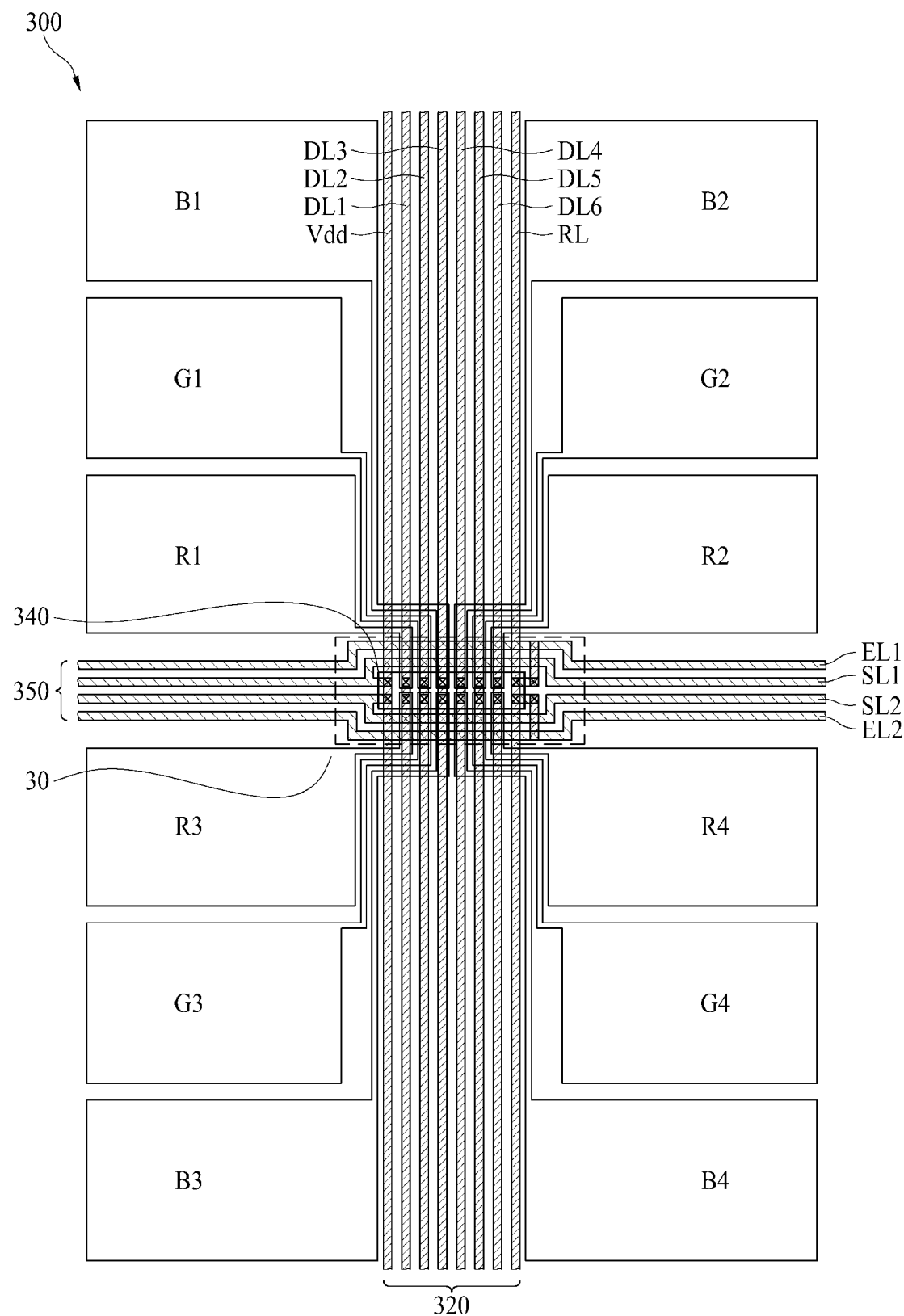
FIG. 11 is a plan view of a display apparatus according to another aspect of the present disclosure.
Figure 12:
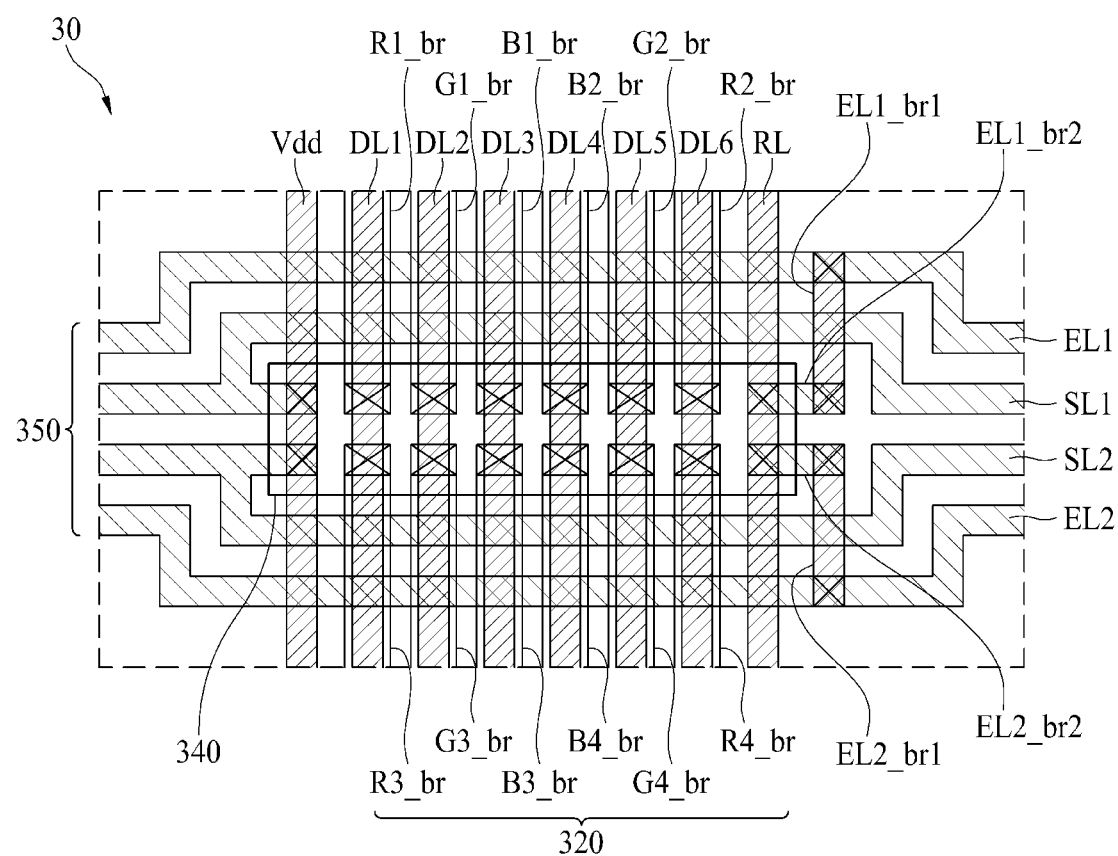
FIG. 12 is an enlarged view of a portion 30 of FIG. 11.
Figure 13:
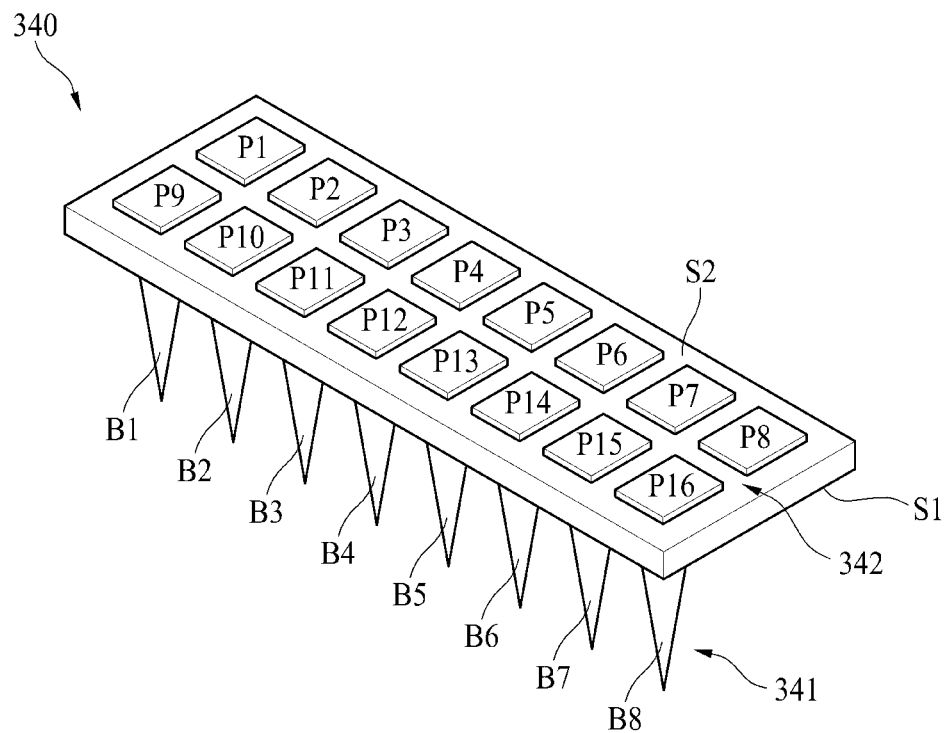
FIG. 13 is a perspective view of a microchip illustrated in FIG. 11.
Figure 14:
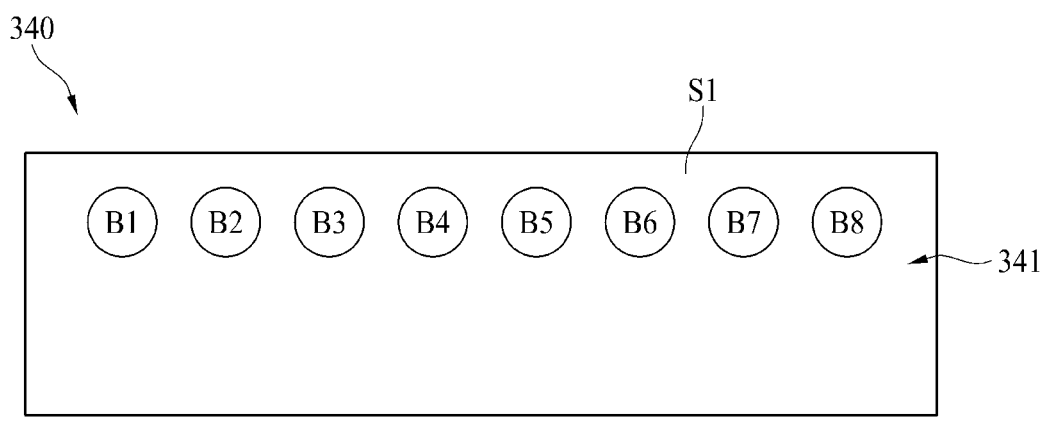
FIG. 14 is a plan view of a first surface of the microchip illustrated in FIG. 13.

FIG. 11 is a plan view of a display apparatus 300 according to another aspect of the present disclosure. FIG. 12 is an enlarged view of a portion 30 of FIG. 11. FIG. 13 is a perspective view of a microchip 340 illustrated in FIG. 11. FIG. 14 is a plan view of a first surface S1 of the microchip 340 illustrated in FIG. 13.

According to another aspect of the present disclosure, the first wiring part 320 may include a first signal line. The first wiring part 320 may include a data line DL as the first signal line. The second wiring part 350 may include a second signal line. The second wiring part 350 may include a scan line SL as the second signal line.

Referring to FIGS. 11 and 12, a first wiring part 320 may include six or more data lines (for example, first to sixth data lines) DL1 to DL6, and a second wiring part 350 may include two or more scan lines (for example, first and second scan lines) SL1 and SL2. Also, the first wiring part 320 may further include a common power line Vdd and an initialization line RL, and the second wiring part 350 may further include two or more sensing lines EL1 and EL2. Also, the first wiring part 320 may include a plurality of first sensing bridges EL1_br1 and EL2_br1, and the second wiring part 350 may include a plurality of second sensing bridges EL1_br2, EL2_br2.

The display apparatus 300 illustrated in FIG. 11, the signal lines of the first wiring part 320 may extend in a lengthwise direction of the drawing, and the signal lines of the second wiring part 350 may extend in a widthwise direction of the drawing.

The microchip 340 may be connected to the six or more data lines DL1 to DL6 and the two or more scan lines SL1 and SL2.

Here, the first pad part 341 of the first microchip 340 may be connected to the six or more data lines DL1 to DL6 disposed in the first wiring part 320. Also, the second pad part 342 of the microchip 340 may be connected to the two or more scan lines SL1 and SL2. Referring to FIGS. 11 and 12, a first pad part 341 of the microchip 340 may be connected to the first wiring part 320, and a second pad part 342 may be connected to the second wiring part 350. Here, a connection between the first pad part 341 and the first wiring part 320 may denote that the first pad part 341 is connected to signal lines or bridges disposed in the first wiring part 320. Also, a connection between the second pad part 342 and the second wiring part 350 may denote that the second pad part 342 is connected to signal lines or bridges disposed in the second wiring part 350.

In detail, the common power line Vdd disposed in the first wiring part 320 may be connected to a first pad B1 of the first pad part 341 of the microchip 340.

The first data line DL1 may be connected to a second pad B2 of the first pad part 341 of the microchip 340.

The second data line DL2 may be connected to a third pad B3 of the first pad part 341 of the microchip 340.

The third data line DL3 may be connected to a fourth pad B4 of the first pad part 341 of the microchip 340.

The fourth data line DL4 may be connected to a fifth pad B5 of the first pad part 341 of the microchip 340.

The fifth data line DL5 may be connected to a sixth pad B6 of the first pad part 341 of the microchip 340.

The sixth data line DL6 may be connected to a seventh pad B7 of the first pad part 341 of the microchip 340.

The initialization line RL may be connected to an eighth pad B8 of the first pad part 341 of the microchip 340.

The first scan line SL1 disposed in the second wiring part 350 may be connected to a first pad P1 of the second pad part 342 of the microchip 340.

The second scan line SL2 may be connected to a ninth pad P6 of the second pad part 342 of the microchip 340.

The first sensing line EL1 disposed in the second wiring part 350 may be connected to an eighth pad P8 of the second pad part 342 of the microchip 340 through a first sensing bridge EL1_br1 disposed in the first wiring part 320 and a second sensing bridge EL1_br2 disposed in the second wiring part 350.

The second sensing line EL2 may be connected to a sixth pad P16 of the second pad part 342 of the microchip 340 through a first sensing bridge EL2_br1 disposed in the first wiring part 320 and a second sensing bridge EL2_br2 disposed in the second wiring part 350.

A first red organic light emitting device R1 may be connected to a second pad P2 of the second pad part 342 of the microchip 340 through a bridge R1_br disposed in the second wiring part 350.

A first green organic light emitting device G1 may be connected to a third pad P3 of the second pad part 342 of the microchip 340 through a bridge G1_br disposed in the second wiring part 350.

A first blue organic light emitting device B1 may be connected to a fourth pad P4 of the second pad part 342 of the microchip 340 through a bridge B1_br disposed in the second wiring part 350.

A second red organic light emitting device R2 may be connected to a seventh pad P7 of the second pad part 342 of the microchip 340 through a bridge R2_br disposed in the second wiring part 350.

A second green organic light emitting device G2 may be connected to a sixth pad P6 of the second pad part 342 of the microchip 340 through a bridge G2_br disposed in the second wiring part 350.

A second blue organic light emitting device B2 may be connected to a fifth pad P5 of the second pad part 342 of the microchip 340 through a bridge B2_br disposed in the second wiring part 350.

A third red organic light emitting device R3 may be connected to a tenth pad P10 of the second pad part 342 of the microchip 340 through a bridge R3_br disposed in the second wiring part 350.

A third green organic light emitting device G3 may be connected to an eleventh pad P11 of the second pad part 342 of the microchip 340 through a bridge G3_br disposed in the second wiring part 350.

A third blue organic light emitting device B3 may be connected to a twelfth pad P12 of the second pad part 342 of the microchip 340 through a bridge B3_br disposed in the second wiring part 350.

A fourth red organic light emitting device R4 may be connected to a fifteenth pad P15 of the second pad part 342 of the microchip 340 through a bridge R4_br disposed in the second wiring part 350.

A fourth green organic light emitting device G4 may be connected to a fourteenth pad P14 of the second pad part 342 of the microchip 340 through a bridge G4_br disposed in the second wiring part 350.

A fourth blue organic light emitting device B4 may be connected to a thirteenth pad P13 of the second pad part 342 of the microchip 340 through a bridge B4_br disposed in the second wiring part 350.

Referring to FIGS. 11 and 12, one microchip 340 may drive twelve organic light emitting devices R1, G1, B1, R2, G2, B2, R3, G3, B3, R4, G4, and B4. Therefore, the microchip 340 according to another aspect of the present disclosure may be connected to twelve or more different first electrodes 171.

According to another aspect of the present disclosure, since the one microchip 340 drives the twelve organic light emitting devices R1, G1, B1, R2, G2, B2, R3, G3, B3, R4, G4, and B4, an area occupied by a device for driving the organic light emitting devices is very small. Accordingly, according to another aspect of the present disclosure, the display apparatus 100 has a good aperture ratio.

As described above, according to the aspects of the present disclosure, since the pad parts are disposed on the first surface and the second surface, the disposition efficiency of the microchip is enhanced. Therefore, since the microchip having a narrow area is connected to a large number of lines or electrodes, a size of the microchip is reduced. Accordingly, since an area of the microchip is reduced, the production efficiency of the microchip is enhanced, and thus, the manufacturing cost of the microchip is reduced.

Moreover, according to the aspects of the present disclosure, since the wiring parts are disposed on and under the microchip, the disposition efficiency of the wiring parts is enhanced. Also, according to the aspects of the present disclosure, since the microchip is aligned on the substrate without a separate align mark, an align mark process may be omitted, and thus, the process cost is reduced.

In the display apparatus according to the aspects of the present disclosure, in comparison with a case of using the related art microchip where a wiring part is disposed on only one surface, twice more pixels may be driven by one microchip having the same size. Accordingly, in comparison with a case of using the related art microchip, the number of microchips configuring a product decreases by half (½), and thus, the manufacturing cost is reduced.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:
1. A display apparatus comprising:
a substrate;
a first wiring part on the substrate;
a first insulation layer on the first wiring part;
a microchip on the first insulation layer;
a second wiring part on the microchip; and
an organic light emitting device on the second wiring part,
wherein the microchip includes:
a first surface and a second surface opposite to each other;
a first pad part on the first surface; and
a second pad part on the second surface, and
the first pad part is connected to the first wiring part, and the second pad part is connected to the second wiring part,
the microchip is between the first wiring part and the second wiring part, and
one of the first wiring part and the second wiring part includes a scan line and another one of the first wiring part and the second wiring part includes a data line.

2. The display apparatus of claim 1, wherein the first insulation layer includes adhesive polymer resin.

3. The display apparatus of claim 1, wherein one of the first pad part and the second pad part of the microchip is connected to a data line and another pad part is connected to a scan line.

4. The display apparatus of claim 1, wherein
the first wiring part includes two or more scan lines,
the second wiring part includes three or more data lines, and
the microchip is connected to the two or more scan lines and the three or more data lines.

5. The display apparatus of claim 4, wherein the microchip is connected to six or more different organic light emitting devices.

6. The display apparatus of claim 4, wherein the first pad part of the microchip is connected to the three or more data lines.

7. The display apparatus of claim 4, wherein the first pad part of the microchip is connected to the two or more scan lines.

8. The display apparatus of claim 4, wherein the second pad part of the microchip is connected to the two or more scan lines.

9. The display apparatus of claim 1, wherein
the first wiring part comprises six or more data lines,
the second wiring part comprises two or more scan lines, and
the microchip is connected to the six or more data lines and the two or more scan lines.

10. The display apparatus of claim 9, wherein the microchip is connected to twelve or more different organic light emitting devices.

11. The display apparatus of claim 9, wherein the first pad part of the microchip is connected to the six or more data lines.

12. The display apparatus of claim 9, wherein the second pad part of the microchip is connected to the two or more scan lines.

13. A display apparatus including a substrate, comprising:
a plurality of scan lines disposed on the substrate;
a first insulation layer disposed on the plurality of scan lines;
a chip set disposed on the first insulation layer, driving at least six unit pixels of the display apparatus, wherein the chip set has first and second surfaces opposite to each other, a first pad part disposed on the first surface and electrically connected to the plurality of scan lines, and a second pad part disposed on the second surface;
a plurality of data lines electrically connected to the second pad part, wherein the number of data lines is one more than the number of scan lines; and
an organic light emitting device disposed on the plurality of data lines,
wherein the chip set is between the plurality of scan lines and the plurality of data lines.

14. The display apparatus of claim 13, wherein the first insulation layer includes adhesive polymer resin.

15. The display apparatus of claim 14, wherein the chip set is secured by the first insulation layer.

16. The display apparatus of claim 13, wherein the chip set includes at least one thin film transistor and an integrated drive circuit.

* * * * *